(12) United States Patent
Ngo

(10) Patent No.: US 6,888,377 B2
(45) Date of Patent: May 3, 2005

(54) DUO-MODE KEEPER CIRCUIT

(75) Inventor: Hung C. Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 10/655,376

(22) Filed: Sep. 4, 2003

(65) Prior Publication Data

US 2005/0052203 A1 Mar. 10, 2005

(51) Int. Cl.[7] .......................... H03K 19/096
(52) U.S. Cl. .................... 326/95; 326/98; 326/121
(58) Field of Search .................. 326/93–98, 121; 327/142, 198

(56) References Cited

U.S. PATENT DOCUMENTS

| | | | | |
|---|---|---|---|---|
| 5,543,731 A | * | 8/1996 | Sigal et al. .................. | 326/40 |
| 5,831,990 A | * | 11/1998 | Queen et al. ................ | 714/724 |
| 5,852,373 A | * | 12/1998 | Chu et al. .................... | 326/98 |
| 6,404,236 B1 | * | 6/2002 | Bernstein et al. ............ | 326/98 |
| 6,496,038 B1 | * | 12/2002 | Sprague et al. .............. | 326/95 |
| 6,690,204 B1 | | 2/2004 | Belluomini et al. ......... | 326/95 |
| 2004/0051560 A1 | | 3/2004 | Belluomini et al. ......... | 326/98 |

* cited by examiner

*Primary Examiner*—Daniel Chang
(74) *Attorney, Agent, or Firm*—Richard F. Frankeny; Winstead Sechrest & Minick P.C.; Casimer K. Salys

(57) ABSTRACT

LSDL logic is provided with circuitry that has logic controls to provide two modes of operation. The half latch and the PFET that normally forms the keeper function on the dynamic node are modified. The inverter function of the series connected PFET and NFET have their corresponding positive and negative power supply terminals coupled to logic gates. In this way, the inverter may be turned ON so that the half latch functions as a keeper or it may be turned OFF to remove it from operating at all in the mode where the LSDL logic circuit needs to operate with a fast pulse clock. Likewise, the positive supply voltage may be removed while allowing the NFET device to operate to turn ON the PFET pull-up device for burn-in operation.

21 Claims, 7 Drawing Sheets

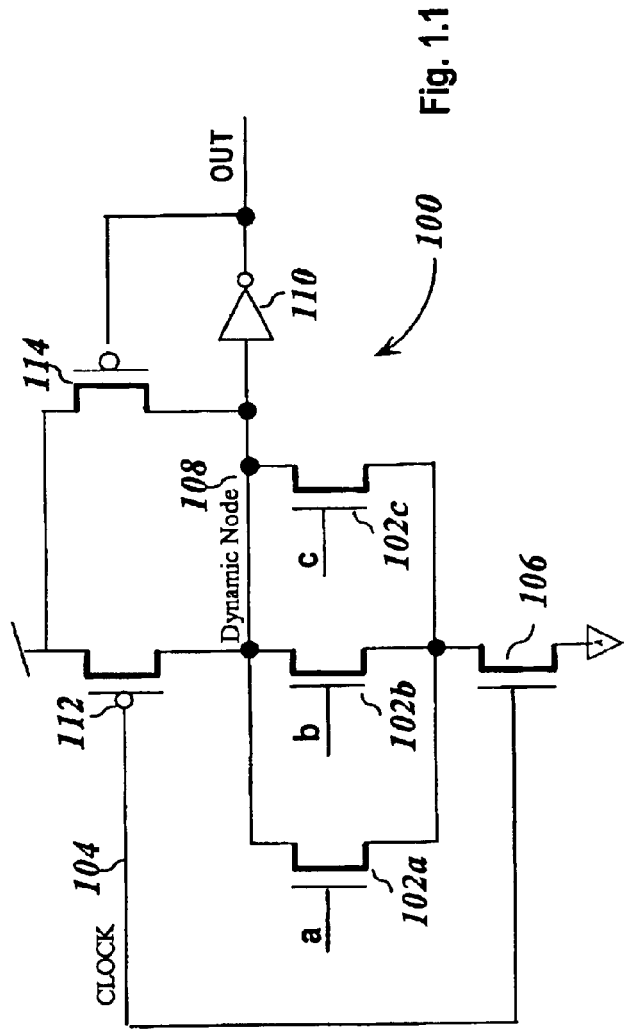
Fig. 1.1
Fig. 1.2
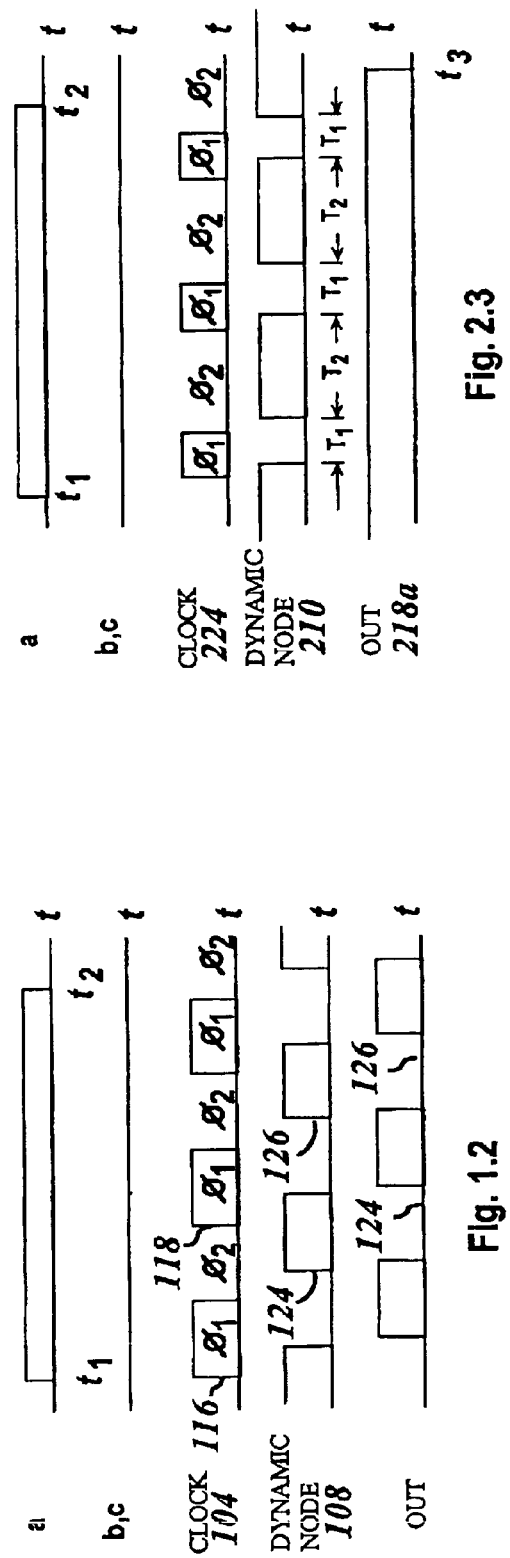
Fig. 2.3

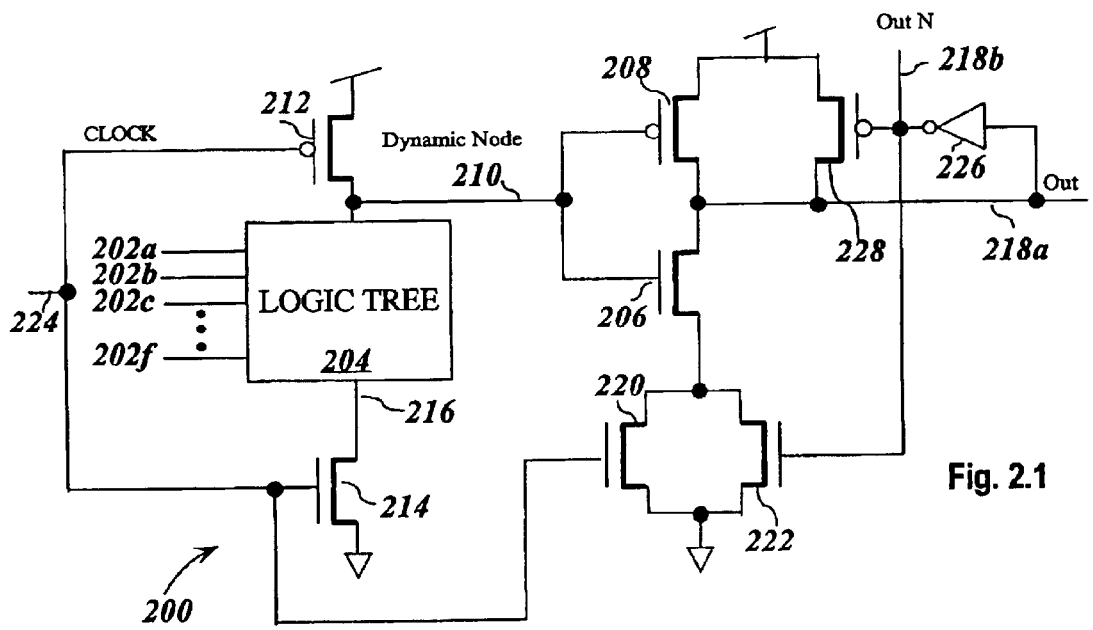
Fig. 2.1
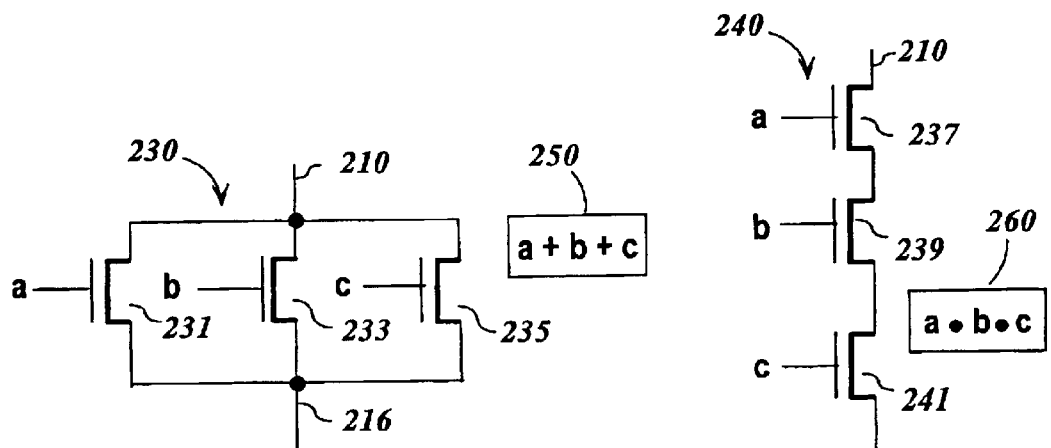
Fig. 2.2.1
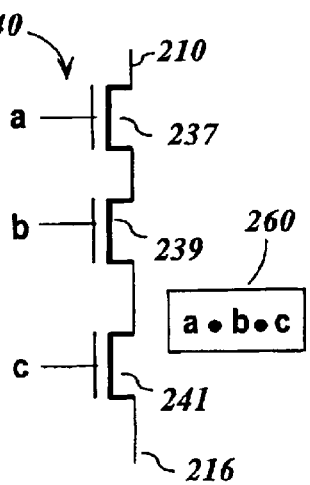
Fig. 2.2.2

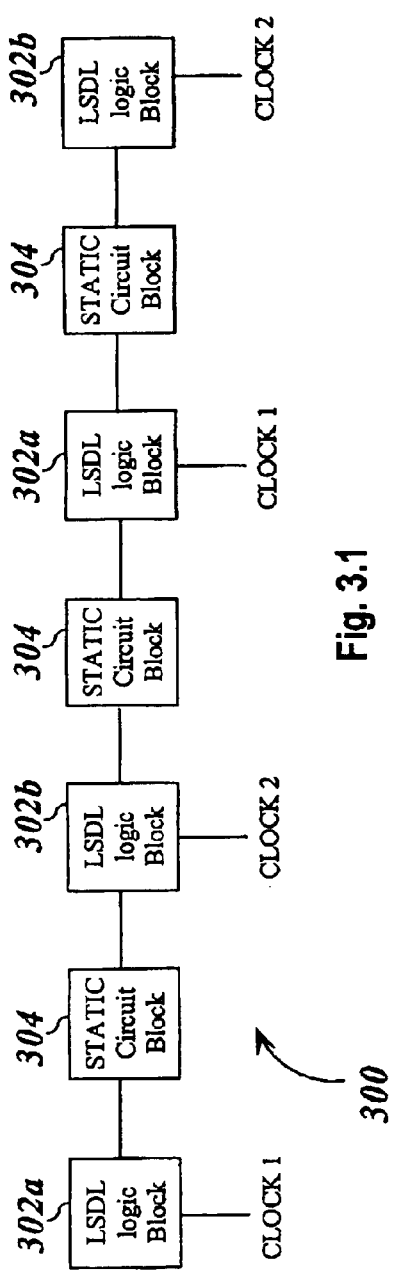
Fig. 3.1
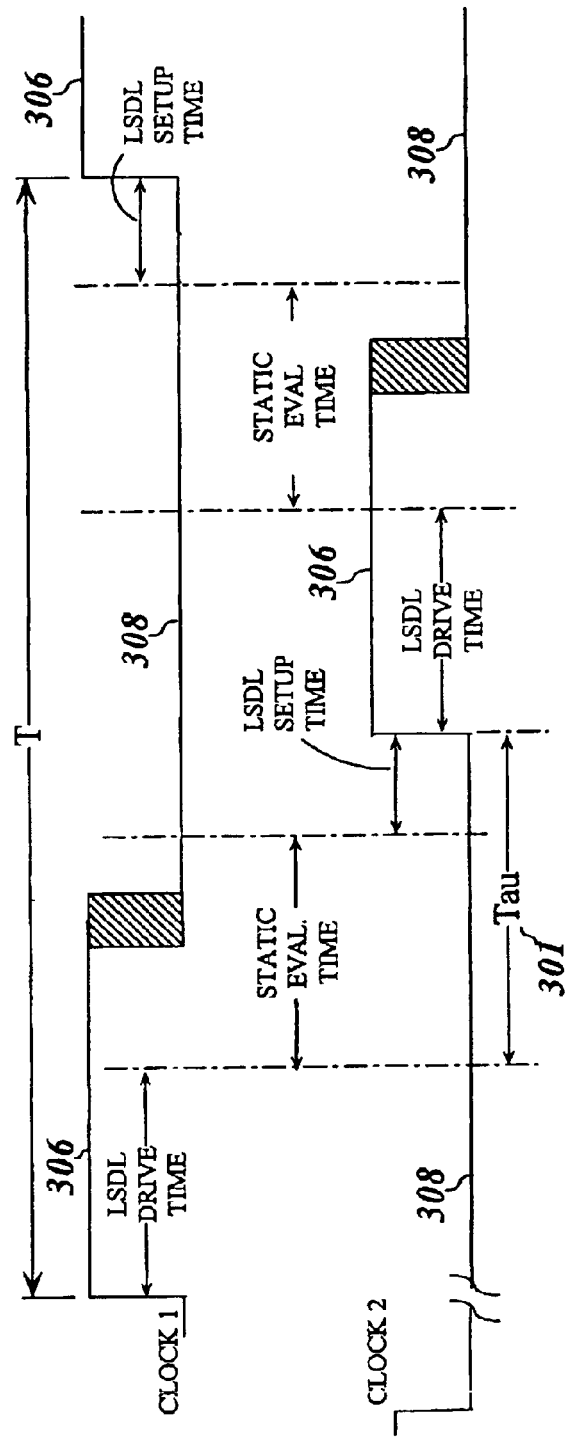
Fig. 3.2

DUO-MODE KEEPER CIRCUIT

CROSS REFERENCE TO RELATED APPLICATION

The present invention is related to the following: U.S. patent application Ser. No. 10/655,375, filed concurrently with this application, entitled "LIMITED SWITCH DYNAMIC LOGIC CIRCUIT WITH KEEPER," and U.S. patent application Ser. No. 10/116,612, filed Apr. 4, 2002, entitled "CIRCUITS AND SYSTEMS FOR LIMITED SWITCH DYNAMIC LOGIC," which are incorporated by reference herein.

TECHNICAL FIELD

The present invention relates in general to metal oxide silicon (MOS) dynamic logic circuits.

BACKGROUND INFORMATION

Modern data processing systems may perform Boolean operations on a set of signals using dynamic logic circuits. Dynamic logic circuits are clocked. During the precharge phase of the clock, the circuit is preconditioned, typically by precharging an internal node (dynamic node) of the circuit by coupling to a power supply rail. During an evaluate phase of the clock, the Boolean function being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock each cycle may consume power even when the logical value of the output is otherwise unchanged.

This may be appreciated by referring to FIG. 1.1 illustrating an exemplary three-input OR dynamic logic gate, and the accompanying timing diagram, FIG. 1.2. Dynamic logic 100, FIG. 1.1, includes three inputs a, b and c coupled to a corresponding gate of NFETs 102a–102c. During an evaluate phase of clock 104, $N_1$, NFET 106 is active, and if any of inputs a, b or c are active, dynamic node 108 is pulled low, and the output OUT goes "high" via inverter 110. Thus, referring to FIG. 1.2, which is illustrative, at $t_1$ input a goes high during a precharge phase $N_2$ of clock 104. During the precharge phase $N_2$ of clock 104, dynamic node 108 is precharged via PFET 112. Half-latch PFET 114 maintains the charge on dynamic node 108 through the evaluate phase, unless one or more of inputs a, b or c is asserted. Half-latch PFET 114 is referred to as a "keeper." In the illustrative timing diagrams in FIG. 1.2, input a is "high" having a time interval $t_1$ through $t_2$ that spans approximately 2½ cycles of clock 104, which includes evaluation phases, 116 and 118. Consequently, dynamic node 108 undergoes two discharge-precharge cycles, 124 and 126. The output node similarly undergoes two discharge-precharge cycles, albeit with opposite phase, 124 and 126. Because the output is discharged during the precharge phase of dynamic node 108, even though the Boolean value of the logical function is "true" (that is, "high" in the embodiment of OR gate 100) the dynamic logic dissipates power even when the input signal states are unchanged.

Additionally, dynamic logic may be implemented in a dual rail embodiment in which all of the logic is duplicated, one gate for each sense of the data. That is, each logic element includes a gate to produce the output signal, and an additional gate to produce its complement. Such implementations may exacerbate the power dissipation in dynamic logic elements, as well as obviate the area advantages of dynamic logic embodiments.

Limited switching dynamic logic (LSDL) circuits produce circuits which mitigate the dynamic switching factor of dynamic logic gates with the addition of static logic devices which serve to isolate the dynamic node from the output node. Co-pending U.S. patent application entitled, "CIRCUITS AND SYSTEMS FOR LIMITED SWITCH DYNAMIC LOGIC," Ser. No. 10/116,612 filed Apr. 4, 2002 and commonly owned, recites such circuits. Additionally, LSDL circuits and systems maintain the area advantage of dynamic logic over static circuits, and further provide both logic senses; that is, the output value and its complement. Typically, LSDL does not require a "keeper" device (PFET 114) as shown in FIG. 1 and used with other dynamic logic, because of its short pulse clock. However, in instances where a 50% duty cycle clock is used a keeper would normally be required to prevent leakage currents. Burn-in is also required for LSDL to stress the dynamic circuits and to test functionality. Burn-in requires the addition of a PFET device to selectively pull up the dynamic node.

There is, therefore, a need for LSDL circuits that work with a slow 50% duty cycle clock which results in a simpler clock generation scheme. Likewise, there is a need to provide LSDL circuits that provide for the needs of burn-in without simply adding a PFET device to the dynamic node on for the burn-in function.

SUMMARY OF THE INVENTION

LSDL circuits are provided with keeper circuitry that is added to the dynamic node to allow two selectable functions. The dynamic node is provided with a half latch that may be controlled to function as a keeper in one mode where controlling leakage is important. In the other mode, during burn-in, the circuitry removes the positive supply voltage from the keeper half latch while enabling a PFET to pull-up the dynamic node. The circuitry allows the keeper half-latch to be turned ON, turned OFF, or allows the circuitry to provide a PFET for burn-in requirements.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 1.1 illustrates, in partial schematic form, a dynamic logic gate which may be used in conjunction with the present invention;

FIG. 1.2 illustrates a timing diagram corresponding to the logic gate embodiment illustrated in FIG. 1.1;

FIG. 2.1 illustrates, in partial schematic form, a standard LSDL device illustrating the static logic devices for isolating the dynamic node from the output node;

FIG. 2.2.1 illustrates, in partial schematic form, circuitry for incorporation in the logic tree of FIG. 2.1 whereby the logic function performed is the logical OR of three input signals;

FIG. 2.2.2 illustrates, in partial schematic form, another circuit for incorporation in the logic tree of FIG. 2.1 whereby the logic function performed is the logical AND of three input signals;

FIG. 2.3 illustrates a timing diagram corresponding to an embodiment of the dynamic logic device of FIG. 2.1 in which the logic function performed is the logical OR of three input signals;

FIG. 3.1 illustrates, in block diagram form, a limited switch dynamic logic system in accordance with an embodiment of the present invention;

FIG. 3.2 illustrates a two-phase clock which may be used in conjunction with the logic system of FIG. 3.1;

DETAILED DESCRIPTION

Figure 4:
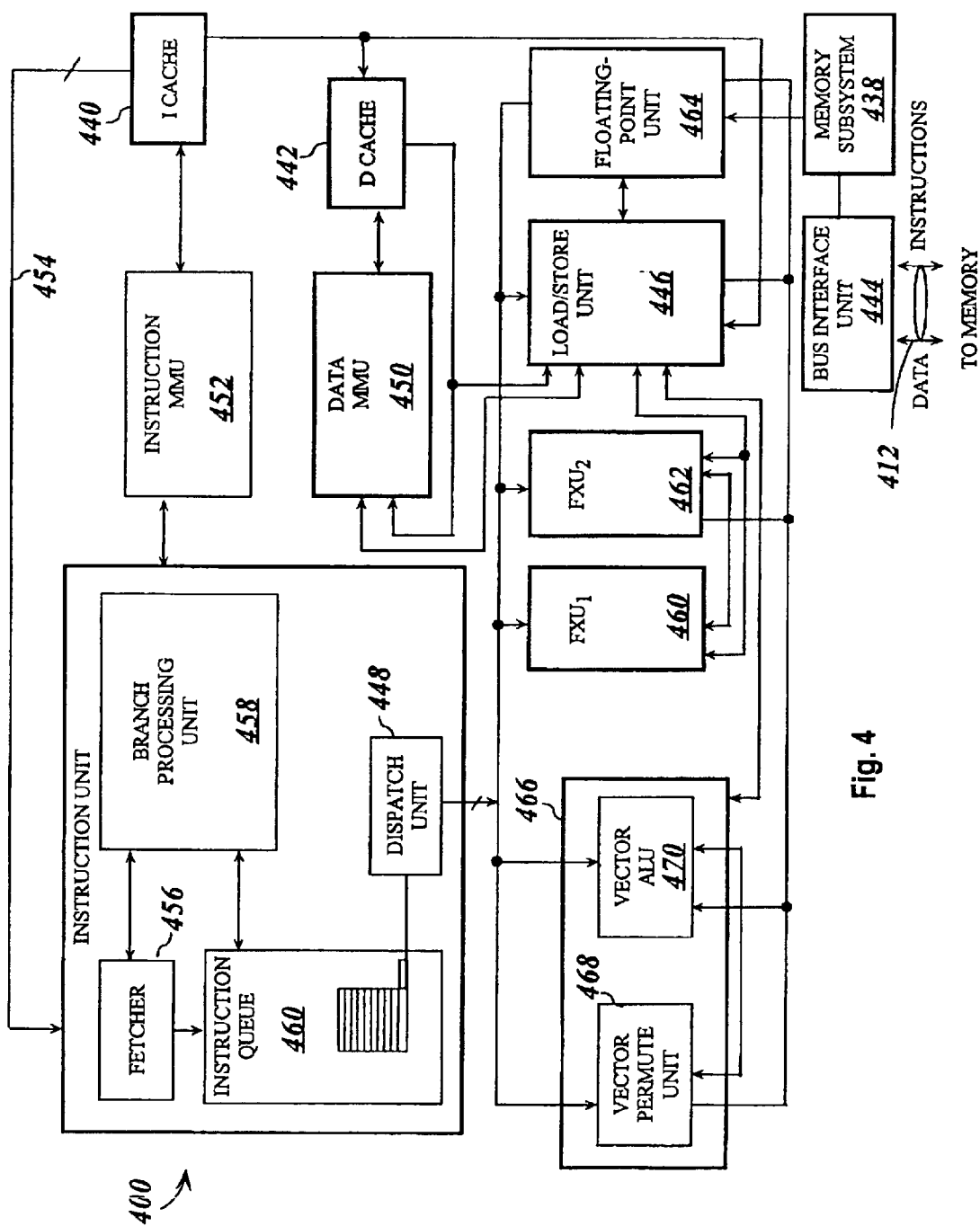
FIG. 4 illustrates a high level block diagram of selected operational blocks within a central processing unit (CPU) incorporating the present inventive principles.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, data formats within communication protocols, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 2.1 illustrates a limited switch dynamic logic (LSDL) device 200. In general, LSDL device 200 receives a plurality, n, of inputs 202a . . . 202f provided to logic tree 204, and outputs a Boolean combination of the inputs. The particular Boolean function performed by LSDL device 200 is reflected in the implementation of logic tree 204 (accounting for the inversion performed by the inverter formed by n-channel field effect transistor (NFET) 206 and p-channel field effect transistor (PFET) 208). Logic tree 204 is coupled between the drain of PFET 212 and the drain of NFET 214, node 216. The junction of the logic tree 204 and the drain of PFET 212 forms dynamic node 210.

For example, FIG. 2.2.1 illustrates logic tree 230 including three parallel connected NFETs, 231, 233 and 235. Logic tree 230 may be used to provide a logic device generating the logical NOR of the three input signals coupled to corresponding ones of the gates of NFETs 231, 233 and 235, a, b and c (as indicated by the Boolean expression 250 in FIG. 2.2.1) and accounting for the inversion via NFET 206 and PFET 208. Similarly, FIG. 2.2.2 illustrates a logic tree 240 including three serially connected NFETs 237, 239 and 241. Logic tree 240 may be used in conjunction with the logic device 200 to generate the logical NAND of the three input signals a, b and c (as indicated by the Boolean expression 260 in FIG. 2.2.2).

Returning to FIG. 2.2.1, dynamic node 210 is coupled to the common junction of the gates of NFET 206 and PFET 208 which invert the signal on dynamic node 210. The inversion of the signal on dynamic node 210 is provided on Out 218a. The transistor pair, 206 and 208, is serially coupled to parallel NFETs 220 and 222. NFET 220 is switched by clock signal 224. Thus, during the evaluate phase of clock signal 224, the inverter pair, NFET 206 and PFET 208 are coupled between the supply rails by the action of NFET 220.

The operation of LSDL device 200 during the evaluate phase, $N_1$, may be further understood by referring to FIG. 2.3 illustrating an exemplary timing diagram corresponding to the dynamic logic circuit of FIG. 2.1 in combination with a logic tree embodiment 230 of FIG. 2.2.1. In this way, for purposes of illustration, the timing diagram in FIG. 2.3 is the counterpart to the timing diagram in FIG. 1.2 for the three-input OR gate 100 depicted in FIG. 1.1. As shown, input a is "high" or "true" between $t_1$ and $t_2$. In the evaluate phase, $N_1$ of clock signal 224, dynamic node 210 is pulled down (intervals $T_1$). In these intervals, Out 218a is held high by the action of the inverter formed by transistors 206 and 208, which inverter is active through the action of NFET 220 as previously described. In the intervening intervals, $T_2$, dynamic node 210 is pulled up via the action of the precharge phase, $N_2$ of clock signal 224, and PFET 212. In these intervals, the inverter is inactive as NFET 220 is off. Out 218a is held "high" by the action of inverter 226 and PFET 228. Note also that the output of inverter 226 may provide a complementary output, Out N 218b. (Thus, with respect to the three-input logic trees in FIGS. 2.2.1 and 2.2.2, the corresponding logic device represents a three-input OR gate and a three-input AND gate, respectively.)

Returning to FIG. 2.1, if the logic tree evaluates "high", that is the Boolean combination of inputs 202a . . . 202d represented by logic tree 204, evaluate high, whereby dynamic node 210 maintains its precharge, Out 218a is discharged via NFET 206 and NFET 220. In the subsequent precharge phase, $N_2$, of clock signal 224, Out 218a is latched via the action of inverter 226 and NFET 222. Thus, referring again to FIG. 2.3, corresponding to the three input OR embodiment of logic device 200 and logic tree 230 (FIG. 2.2.1) at $t_2$ input a falls, and in the succeeding evaluate phase of clock signal 224, dynamic node 210 is held high by the precharge. The inverter pair, NFETs 206 and 208, are active in the evaluate phase of $N_1$, of clock signal 224 because of the action of NFET 220. Consequently, Out 218a falls ($t_3$). In the succeeding precharge phase, $N_2$ of clock signal 224, Out 218a is latched in the "low" state, as previously described.

In this way, LSDL device 200 in FIG. 2.1, may provide a static switching factor on Out 218a, and likewise with respect to the complementary output Out N 218b. It would also be recognized by artisans of ordinary skill that although LSDL device 200, FIG. 2.1, has been described in conjunction with the particular logic tree embodiments of FIG. 2.2.1 and FIG. 2.2.2, the principles of the present invention apply to alternative embodiments having other logic tree implementations, and such alternative embodiments fall within the spirit and the scope of the present invention.

Note too, as illustrated in the exemplary timing diagram in FIG. 2.3, the duty factor of the clock signal may have a value that is less than fifty percent (50%). In such an embodiment, the evaluate phase, $N_1$, of the clock signal may be shorter in duration than the precharge phase, $N_2$. A clock signal having a duty factor less than fifty percent (50%) may be referred to as a pulse (or pulsed) clock signal. Note that a width of the evaluate phase may be sufficiently short that leakage from the dynamic node may be inconsequential. That is, leakage does not affect the evaluation of the node.

In such a clock signal embodiment, the size of the precharge device (PFET 212 in the embodiment of FIG. 2.1) may be reduced. It would be recognized by those of ordinary skill in the art that a symmetric clock signal has a fifty percent (50%) duty cycle; in an embodiment in which the duty cycle of the clock signal is less than fifty percent (50%), the size of the precharge device may be reduced concomitantly. In particular, an embodiment of the present invention may be implemented with a clock signal duty cycle of approximately thirty percent (30%). Additionally, while logic device 200 has been described from the perspective of "positive" logic, alternative embodiments in accordance with the present inventive principles may be implemented in the context of "negative" logic and such embodiments would also fall within the spirit and scope of the present invention.

Figure 6:
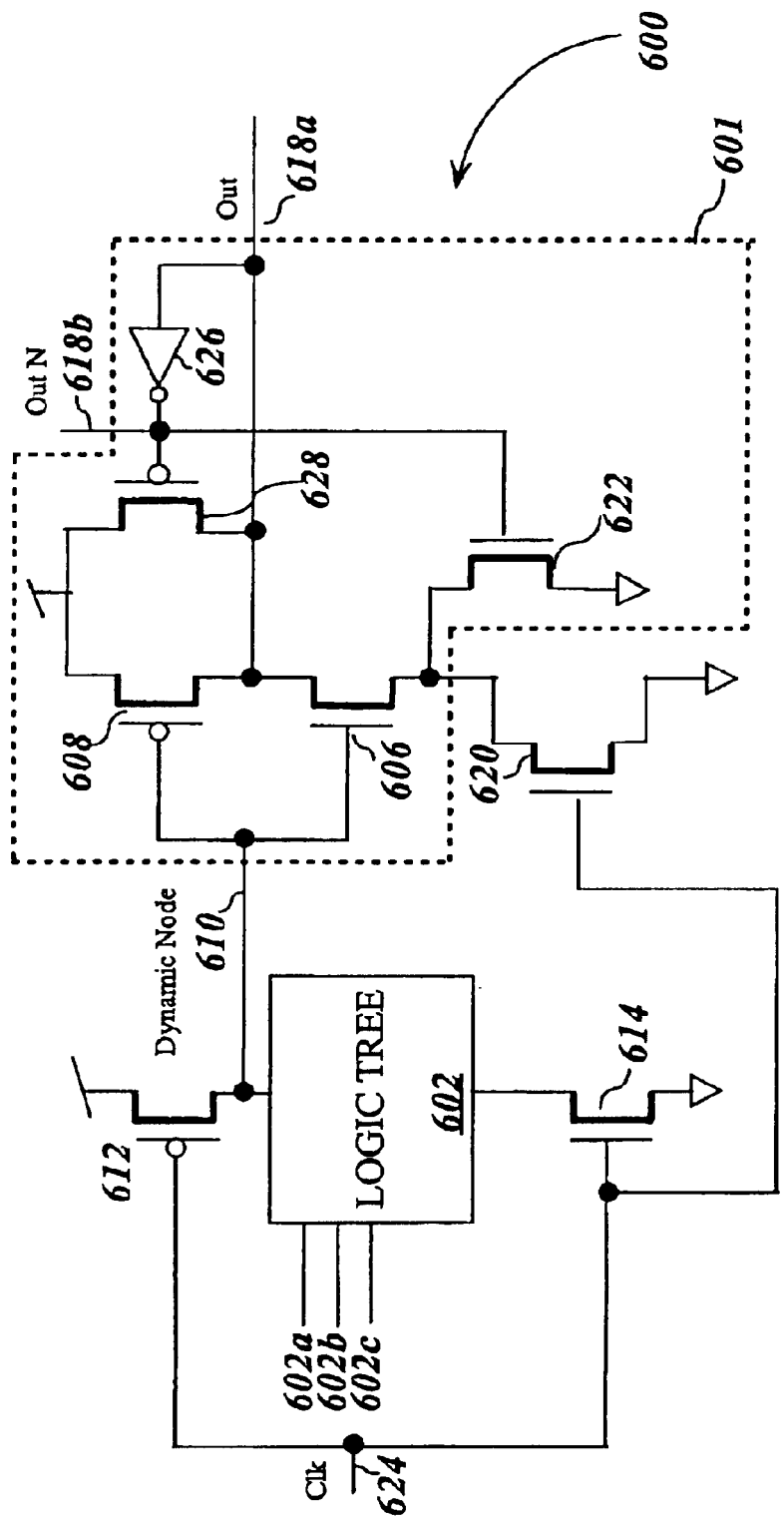
FIG. 6 is a block diagram of a typical LSDL circuit for practicing embodiments of the present invention illustrating static logic circuits and complementary outputs.

FIG. 6 is an LSDL circuit (LSDL) 600 and is essentially a copy of the embodiment in FIG. 2.1 where logic tree 204 is replaced with a specific three input (602a–602c) logic tree 602. This specific standard LSDL 600 is suitable to practice embodiments of the present invention. Static logic devices 601 are highlighted (dotted lines) to show inputs and outputs that are present in LSDL circuits configured for use with embodiments of the present invention. Static logic devices 601 are highlighted to show inputs and outputs that are present in LSDL circuits configured for use with embodiments of the present invention. Clock signal 624 couples to the gates of NFET 614 and PFET 612 as well as NFET 620 in static logic 601. Dynamic node 610 has a logic state determined by logic tree 602 when clock signal 624 is a logic one and a precharge state when clock signal 624 is a logic zero. A half latch is formed by PFET 628 and inverter 626 and is common to circuits in embodiments of the present invention. Out 618a is the logic true output of LSDL 600 and Out N 618b is the complementary output of Out 618a. NFET 622 completes the latch function on the output of LSDL 600 and is a common feedback device in circuits in embodiments of the present invention.

Figure 7:
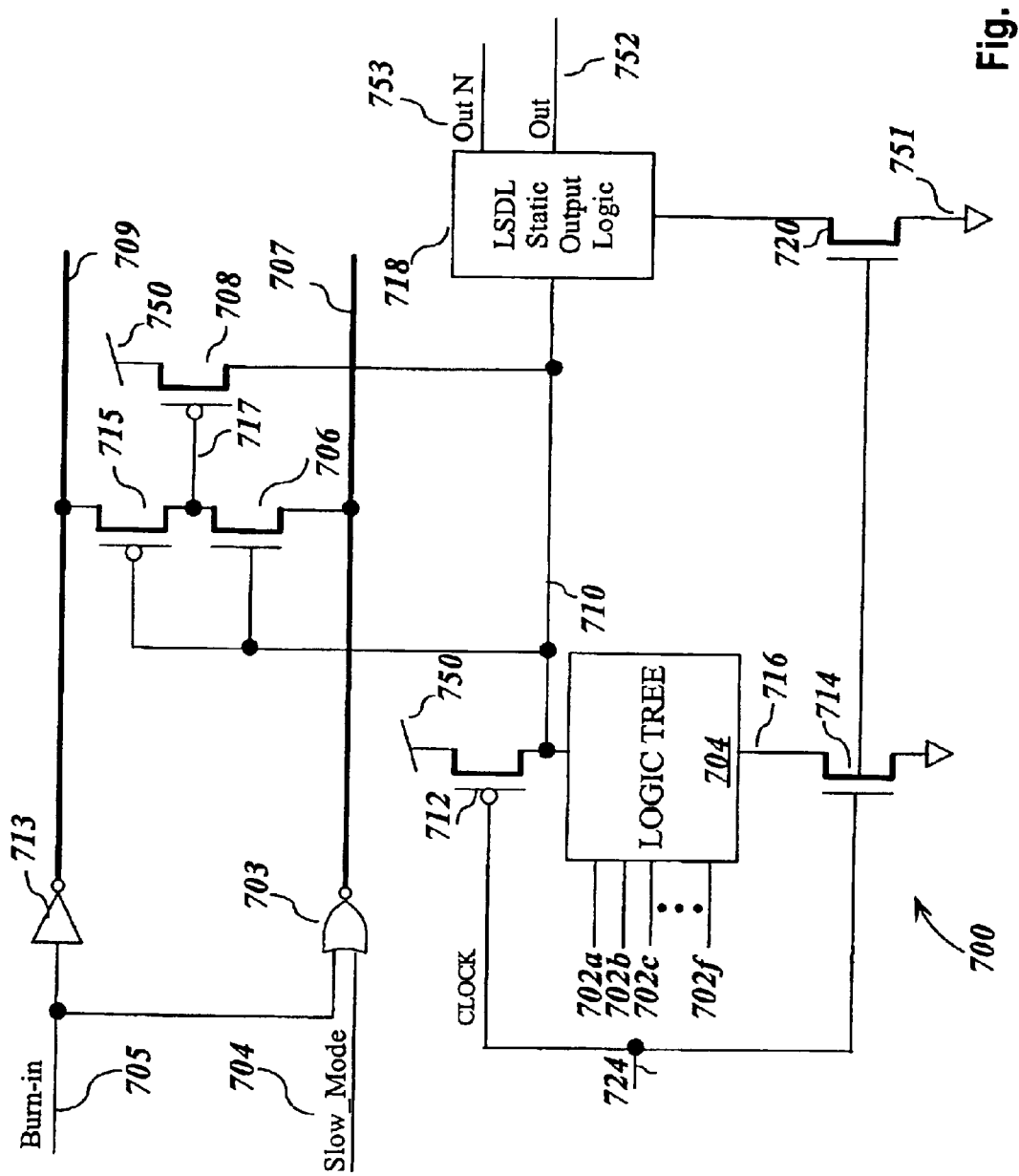
FIG. 7 is a block diagram of an LSDL circuit with a dual mode keeper circuit according to embodiments of the present invention.

FIG. 7 is an LSDL circuit 700 having logic inputs 702a–702f and outputs Out 752 and complementary output Out N 753 according to embodiments of the present invention. LSDL static output logic 718 is shown in block diagram form and comprises circuitry corresponding to static logic 601 in FIG. 6. The present invention is focused on additional circuitry coupled to dynamic node 710. LSDL circuit 700 has a power supply voltage corresponding to positive potential 750 and a negative or ground potential 751. It is understood that inverter gate 713 and NOR gate 703 are powered by the voltage between potentials 750 and 751 even though the connection is not shown. When the output 709 of inverter 713 is a logic one, it is coupled to potential 750 and forms a "virtual" positive power supply node which is coupled to source of PFET 715. Likewise, when the output 707 of NOR logic gate 713 is a logic zero, it is coupled to potential 751 and forms a "virtual" negative or ground power supply node which is coupled to the source of NFET 706. The source of PFET 708 is coupled directly to potential 750. PFET 715 and NFET 706 form an inverter gate function when the source of PFET 715 is at a potential corresponding to a logic one at output 709 and the source of NFET 706 is at potential corresponding to a logic zero at output 707. If the source of NFET 706 is at a logic one or the source of PFET is at a logic zero, these FETs cannot be gated ON. This configuration allows the inverter gate function of PFET 715 and NFET 706 to be controlled by inverter gate 713 and NOR logic gate 703 depending on the logic states of signals, Burn-in 705 and Slow_Mode 704. If Burn-in 705 is a logic one, both output 709 and output 707 are at a logic zero. In this case, PFET 715 can turn ON when dynamic node 710 is a logic zero. Also NFET 706 can turn ON when dynamic node 710 is a logic one. Therefore when Burn-in 705 is a logic one node 717 is a logic zero no matter which one of PFET 715 or NFET 706 turns ON. Therefore, during a burn-in mode (Burn-in 705 is a logic one) PFET 708 may be activated. When Burn-in 705 is a logic one the state of Slow_Mode 705 is a "don't care" condition. When Burn-in 705 is a logic zero (burn-in mode not selected), output 709 is a logic one and the source of PFET 715 is a logic one or at the "virtual" positive power supply potential. In this case, the function of the inverter formed by PFET 715 and NFT 706 is controlled by the logic state of Slow_Mode 704. If Slow_Mode 704 is a logic zero (Slow_Mode not selected), the source of NFET 706 is also a logic one. NFET 706 may be turned ON if dynamic node 710 is a logic one, however this would apply a logic one to node 717 which turns OFF PFET 708. While PFET 715 may still be turned ON when dynamic node 710 is a logic zero, it would also turn OFF PFET 708. Therefore, when neither mode is selected, PFET cannot affect dynamic node 710. However, when Slow_Mode 704 is a logic one, then the source of PFET 715 is a logic one and the source of NFET 706 is a logic zero and their inverter function is enabled. The combination of PFET 715, NFET 706 and PFET 708 forms the half latch keeper circuit which reduces leakage on the dynamic node if a 50% duty cycle clock signal is used for clock 724. When Slow_Mode 704 is a logic zero, the normal short pulse clock signal may be applied to clock 724. LSDL circuit allows all the functions necessary for burn-in and operation with a 50% duty cycle clock to be controlled by the states of Burn-in 705 and Slow_Mode 704. When the keeper circuit function and the burn-in PFET 708 function are not required, then the keeper circuitry is disabled removing its affect on dynamic node 710.

FIG. 3.1 illustrates a portion 300 of a data processing system incorporating LSDL circuits in accordance with the present inventive principles. System portion 300 may be implemented using a two-phase clock signal (denoted clock 1 and clock 2). A timing diagram which may be associated with system portion 300 will be discussed in conjunction with FIG. 3.2. LSDL blocks 302b that may be clocked by a second clock signal phase, clock 2, alternates with LSDL block 302a clocked by the first clock signal phase, clock 1. Additionally, system portion 300 may include static logic elements 304 between LSDL blocks. Typically, static circuit blocks 304 may include gain stages, inverters or static logic gates. Static circuit blocks 304 are differentiated from LSDL blocks 302a and 302b as they do not have dynamic nodes that have a precharge cycle. However, alternative embodiments may include any amount of static logic. Additionally, as previously mentioned, an embodiment of system portion 300 may be implemented without static circuit blocks 304.

FIG. 3.2 illustrates a timing diagram which may correspond to a logic system employing a two-phase, pulsed clock signal, such as system portion 300, FIG. 3.1, in accordance with the present inventive principles. The LSDL circuits evaluate during the LSDL evaluate, or drive, portion 306 of their respective clock signals. As previously described, the duty factor of each of clock 1 and clock 2 may be less than fifty percent (50%). The width of the LSDL drive portions 306 of the clock signals need only be sufficiently wide to allow the evaluate node (such as dynamic node 210, FIG. 2.1) to be discharged through the logic tree (for example, logic tree 204, FIG. 2.1). As previously described, the duration of the drive portion may be sufficiently narrow that leakage from the evaluation may be inconsequential. Consequently, LSDL circuits are not particularly sensitive to the falling edge of the clock signals, and in FIG. 3.2, the falling portion of the evaluate phase 306 of the clock signals has been depicted with cross-hatching. As noted herein above, the duty factor of clock 1 and clock 2 may be approximately thirty percent (30%) in an exemplary embodiment of the present invention. (It would be appreciated, however, that the present inventive principles may be incorporated in alternative embodiments which have other duty factors.) During the precharge portion 308 of the clock signals, the dynamic node (for example, dynamic node 210, FIG. 2.1) is precharged, as previously discussed. Clock 2 is 180° ($\pi$ radians) out of phase with clock 1 (shifted in time one-half of period T). Thus as shown, the evaluate portion 306 of clock 2 occurs during the precharge phase 308 of clock 1. Because in LSDL circuits, the output states may not change during the evaluate phase of the driving clock signal; the inputs to LSDL blocks, for example, LSDL blocks 302b, FIG. 3.1, are stable during the evaluate phase of the corresponding driving clock signal, clock 2. The time interval, between the end of the evaluate portion 306 of clock 1 and the rising edge of clock 2 may be established by the setup time of the LSDL, and the evaluation time of the static blocks, if any (for example, static blocks 304, FIG. 3.1). The time, Tau 301, together with duty factor may determine the minimum clock signal period for a particular LSDL circuit implementation. Thus, a system portion 300, FIG. 3.1 having a two-phase clock signal effects two dynamic evaluations per period, T, of the driving clock signals. It would be further appreciated by those of ordinary skill in the art that, in general, the present inventive principles may be incorporated in alternative embodiments of an LSDL system having a plurality, n, of clock signal phases. Such alternative embodiments would fall within the spirit and scope of the present invention.

An LSDL system in accordance with the principles of the present invention, such as system 300, FIG. 3.1, may be used, in an exemplary embodiment, in an arithmetic logic unit (ALU). A typical ALU architecture requires a significant number of exclusive-OR (XOR) operations. The XOR of two Boolean values requires having both senses of each of the Boolean values, that is, both the value and its complement ($a \oplus b = ab' + a'b$). As previously described, use of dual rail dynamic logic to implement such functionality obviates the advantages in area and power otherwise obtained by dynamic logic. A data processing system including an ALU embodying the present inventive principles is illustrated in FIG. 4.

FIG. 4 is a high level functional block diagram of selected operational blocks that may be included in a central processing unit (CPU) 400. In the illustrated embodiment, CPU 400 includes internal instruction cache (I-cache) 440 and data cache (D-cache) 442 which are accessible to memory (not shown in FIG. 4) through bus 412, bus interface unit 444, memory subsystem 438, load/store unit 446 and corresponding memory management units: data MMU 450 and instruction MMU 452. In the depicted architecture, CPU 400 operates on data in response to instructions retrieved from I-cache 440 through instruction dispatch unit 448. Dispatch unit 448 may be included in instruction unit 454 which may also incorporate fetch unit 456 and branch processing unit 458 which controls instruction branching. An instruction queue 460 may interface fetch unit 456 and dispatch unit 448. In response to dispatched instructions, data retrieved from D-cache 442 by load/store unit 446 can be operated upon by one of fixed point unit (FXU) 460, FXU 462 or floating point execution unit (FPU) 464. Additionally, CPU 400 provides for parallel processing of multiple data items via vector execution unit (VXU) 466. VXU 466 includes vector permute unit 468 which performs permutation operations on vector operands, and vector arithmetic logic unit (VALU) 470 which performs vector arithmetic operations, which may include both fixed-point and floating-point operations on vector operands. VALU 470 may be implemented using LSDL in accordance with the present inventive principles, and in particular may incorporate LSDL logic systems, of which LSDL system 300, FIG. 3.1 is exemplary.

Figure 5:
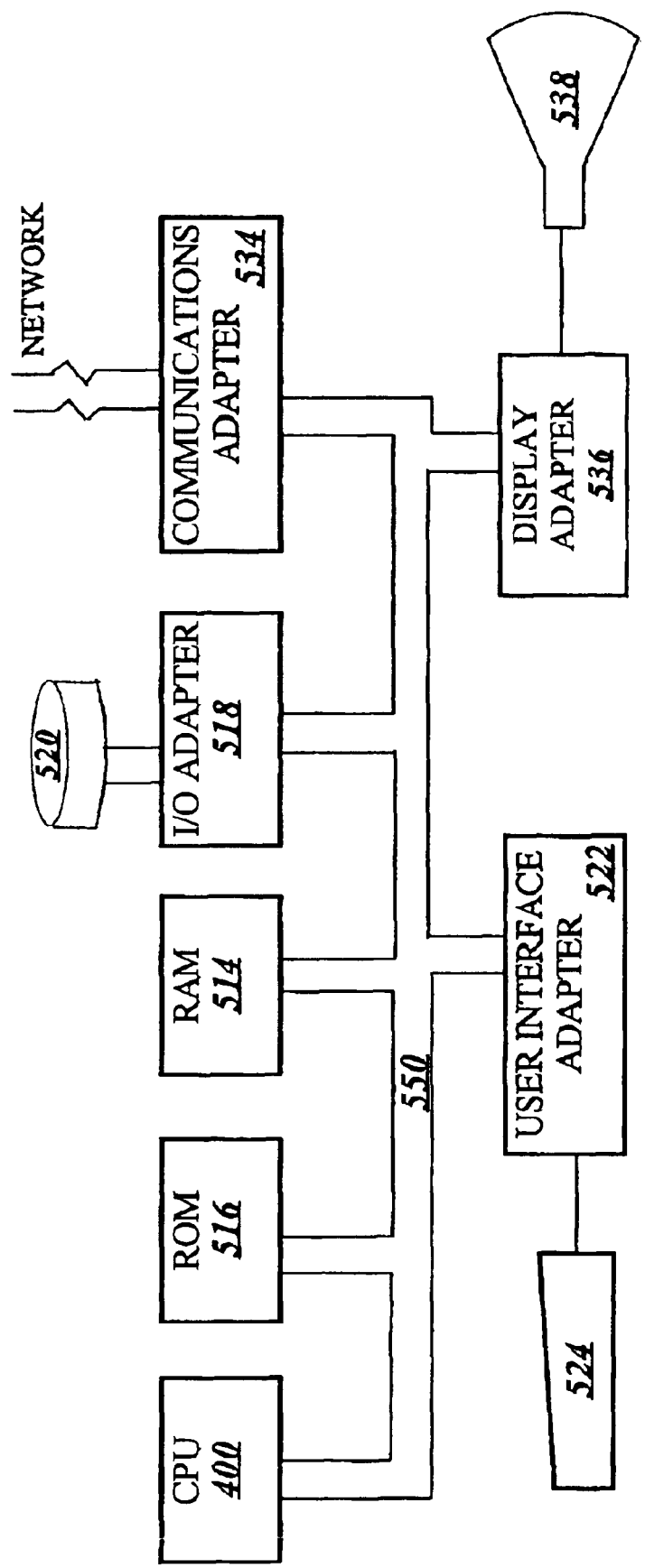
FIG. 5 illustrates a data processing system configured in accordance with the present invention.

A representative hardware environment 500 for practicing the present invention is depicted in FIG. 5, which illustrates a typical hardware configuration of a data processing system in accordance with the subject invention having CPU 400, incorporating the present inventive principles, and a number of other units interconnected via system bus 550. The data processing system shown in FIG. 5 includes random access memory (RAM) 514, read only memory (ROM) 516, and input/output (I/O) adapter 518 for connecting peripheral devices such as disk units 520 to bus 550, user interface adapter 522 for connecting keyboard 524, mouse 526, and/or other user interface devices such as a touch screen device (not shown) to bus 550, communication adapter 534 for connecting the system to a data processing network, and display adapter 536 for connecting bus 550 to display device 538. Note that CPU 400 may reside on a single integrated circuit.

Although the present invention and its advantages have been described in detail, it should be understood that various changes, substitutions and alterations can be made herein without departing from the spirit and scope of the invention as defined by the appended claims.

What is claimed is:

1. A limited switch dynamic logic circuit comprising:
   a dynamic node;
   precharge circuitry coupled to said dynamic for precharging the dynamic node to a logic one during a precharge cycle of a clock signal;
   a logic tree coupled to said dynamic node for evaluating said dynamic node to a logic one or a logic zero in response to combinations of logic states of plurality of logic inputs coupled to said logic tree during an evaluation cycle of said clock signal;
   static logic circuitry for latching a logic state of said dynamic node and holding said logic state during said precharge cycle of said clock signal, wherein said static logic circuitry generates said output and said complementary output; and
   a keeper circuit having a keeper input coupled to said dynamic node, a keeper output coupled to said dynamic node, a first supply terminal coupled to a first supply signal, and a second supply terminal coupled to a second supply signal, wherein said keeper output reinforces a first logic state of said dynamic node and does not reinforce a second logic state of said dynamic node in response to logic states of said first and second supply signals.

2. The limited switch dynamic logic circuit of claim 1 further comprising a first logic gate having a first mode input coupled to a first mode signal and a first mode output coupled to said first supply terminal and generating said first supply signal, wherein said first supply signal has said first logic state when said first mode signal has said second logic state and said first supply signal has said second logic state when said first mode signal has said first logic state.

3. The limited switch dynamic logic circuit of claim 1 further comprising a second logic gate having a second mode input coupled to a second mode signal, a third mode input coupled to said first mode signal and a second mode output coupled to said second supply terminal and generating said second supply signal, wherein said second supply signal has said first logic state when said second mode signal has said second logic state and said third mode output has said second logic state and said second supply signal has said second logic state when either said first or second mode signal has said first logic state.

4. The limited switch dynamic logic circuit of claim 2, wherein said first logic gate is an inverter logic gate.

5. The limited switch dynamic logic circuit of claim 3, wherein said second logic gate is a NOR logic gate.

6. The limited switch dynamic logic circuit of claim 1, wherein said keeper circuit comprises:
   an inverter having an input coupled to said dynamic node, an inverter output, a positive power supply input coupled to said first supply terminal, and a second power supply input coupled to said second supply terminal; and
   an electronic switch having an input coupled to said inverter output, a first terminal coupled to said positive power supply voltage and a second terminal coupled to said dynamic node, wherein said electronic switch couples said positive power supply voltage to said dynamic node when said inverter output has said first logic state and is OFF when said inverter output has said second logic state.

7. The limited switch dynamic logic circuit of claim 6, wherein said inverter comprises:
   a first P channel field effect transistor (PFET) having a drain terminal coupled to said positive power supply input, a source terminal, and a gate terminal coupled to said dynamic node; and
   a first N channel field effect transistor (NFET) having a drain terminal coupled to said source terminal of said first PFET, a gate terminal coupled to said dynamic node, and a source terminal coupled to said negative power supply input.

8. The limited switch dynamic logic circuit of claim 7, wherein said electronic switch comprises a second PFET having a gate terminal coupled to said inverter output, a source terminal coupled to said positive power supply voltage and a drain terminal coupled to said dynamic node.

9. The limited switch dynamic logic circuit of claim 2, wherein said first mode signal is a burn-in mode signal having said first logic state when a burn-in mode is disabled and said second logic state when said burn-in mode is enabled.

10. The limited switch dynamic logic circuit of claim 2, wherein said second mode signal is a slow_mode signal setting a fifty percent duty cycle clock mode, wherein said slow_mode signal enables a fifty percent duty cycle clock when said slow_mode signal has said second logic state and enables a pulse clock when said slow_mode signal has said first logic state.

11. A logic device comprising:
   a plurality of limited switch dynamic logic (LSDL) circuits wherein each of said LSDL circuits has a dynamic node, precharge circuitry coupled to said dynamic for precharging the dynamic node to a logic one during a precharge cycle of a clock signal, a logic tree coupled to said dynamic node for evaluating said dynamic node to a logic one or a logic zero in response to combinations of logic states of plurality of logic inputs coupled to said logic tree during an evaluation cycle of said clock signal, static logic circuitry for latching a logic state of said dynamic node and holding said logic state during said precharge cycle of said clock signal, wherein said static logic circuitry generates said output and said complementary output, and a keeper circuit having a keeper input coupled to said dynamic node, a keeper output coupled to said dynamic node, a first supply terminal coupled to a first supply signal, and a second supply terminal coupled to a second supply signal, wherein said keeper output reinforces a first logic state of said dynamic node and does not reinforce a second logic state of said dynamic node in response to logic states of said first and second supply signals.

12. The logic device of claim 11 further comprising a first logic gate having a first mode input coupled to a first mode signal and a first mode output coupled to said first supply terminal and generating said first supply signal, wherein said first supply signal has said first logic state when said first mode signal has said second logic state and said first supply signal has said second logic state when said first mode signal has said first logic state.

13. The logic device of claim 11 further comprising a second logic gate having a second mode input coupled to a second mode signal, a third mode input coupled to said first mode signal and a second mode output coupled to said second supply terminal and generating said second supply signal, wherein said second supply signal has said first logic state when said second mode signal has said second logic state and said third mode output has said second logic state and said second supply signal has said second logic state when either said first or second mode signal has said first logic state.

14. The logic device of claim 11, wherein said keeper circuit comprises:
   an inverter having an input coupled to said dynamic node, an inverter output, a positive power supply input coupled to said first supply terminal, and a second power supply input coupled to said second supply terminal; and
   an electronic switch having an input coupled to said inverter output, a first terminal coupled to said positive power supply voltage and a second terminal coupled to said dynamic node, wherein said electronic switch couples said positive power supply voltage to said dynamic node when said inverter output has said first logic state and is OFF when said inverter output has said second logic state.

15. The logic device of claim 12, wherein said first mode signal is a burn-in mode signal having said first logic state when a burn-in mode is disabled and said second logic state when said burn-in mode is enabled.

16. The logic device of claim 12, wherein said second mode signal is a slow_mode signal setting a fifty percent duty cycle clock mode, wherein said slow_mode signal enables a fifty percent duty cycle clock when said slow_mode signal has said second logic state and enables a pulse clock when said slow_mode signal has said first logic state.

17. A data processing system comprising:
   a central processing unit (CPU); and
   a memory operable for communicating instructions and operand data to said CPU, wherein said CPU includes a logic system having a logic device, said logic device including a plurality of limited switch dynamic logic (LSDL) circuits wherein each of said LSDL circuits has a dynamic node, precharge circuitry coupled to said dynamic for precharging the dynamic node to a logic one during a precharge cycle of a clock signal, a logic tree coupled to said dynamic node for evaluating said dynamic node to a logic one or a logic zero in response to combinations of logic states of plurality of logic inputs coupled to said logic tree during an evaluation cycle of said clock signal, static logic circuitry for latching a logic state of said dynamic node and holding said logic state during said precharge cycle of said clock signal, wherein said static logic circuitry generates said output and said complementary output, and a keeper circuit having a keeper input coupled to said dynamic node, a keeper output coupled to said dynamic node, a first supply terminal coupled to a first supply signal, and a second supply terminal coupled to a second supply signal, wherein said keeper output reinforces a first logic state of said dynamic node and does not reinforce a second logic state of said dynamic node in response to logic states of said first and second supply signals.

18. The data processing system of claim 17 further comprising a first logic gate having a first mode input coupled to a first mode signal and a first mode output coupled to said first supply terminal, wherein said first mode output has said first logic state when said first mode signal has said second logic state and said first mode output has said second logic state when said first mode signal has said first logic state.

19. The data processing system of claim 17 further comprising a second logic gate having a second mode input coupled to a second mode signal, a third mode input coupled to said first mode signal and a second mode output coupled to said second supply terminal, wherein said second mode output has said first logic state when said second mode signal has said second logic state and said third mode output has said second logic state and said second mode output has said second logic state when either said first or second mode signal has said first logic state.

20. The data processing system of claim 17, wherein said keeper circuit comprises:

an inverter having an input coupled to said dynamic node, an inverter output, a positive power supply input coupled to said first supply terminal, and a second power supply input coupled to said second supply terminal; and an electronic switch having an input coupled to said inverter output, a first terminal coupled to said positive power supply voltage and a second terminal coupled to said dynamic node, wherein said electronic switch couples said positive power supply voltage to said dynamic node when said inverter output has said first logic state and is OFF when said inverter output has said second logic state.

21. A limited switch dynamic logic circuit comprising:

a dynamic node;

precharge circuitry coupled to said dynamic for precharging the dynamic node to a logic one during a precharge cycle of a clock signal;

a logic tree coupled to said dynamic node for evaluating said dynamic node to a logic one or a logic zero in response to combinations of logic states of plurality of logic inputs coupled to said logic tree during an evaluation cycle of said clock signal;

static logic circuitry for latching a logic state of said dynamic node and holding said logic state during said precharge cycle of said clock signal, wherein said static logic circuitry generates said output and said complementary output; and a keeper circuit having a keeper input coupled to said dynamic node, a keeper output coupled to said dynamic node, a first supply terminal coupled to a first supply signal, and a second supply terminal coupled to a second supply signal, wherein said keeper circuit is selectively enabled during a burn-in mode and a slow clock mode by logic states of said first and second supply signals.

* * * * *